United States Patent [19]

Nagahama

[11] Patent Number: 4,996,582
[45] Date of Patent: Feb. 26, 1991

[54] FIELD EFFECT TRANSISTOR FOR MICROSTRIP MOUNTING AND MICROSTRIP-MOUNTED TRANSISTOR ASSEMBLY

[75] Inventor: Kohki Nagahama, Itami, Japan
[73] Assignee: Mitsubishi Denki Kabushiki Kaisha
[21] Appl. No.: 404,636
[22] Filed: Sep. 8, 1989

[30] Foreign Application Priority Data
Sep. 14, 1988 [JP] Japan .................................. 63-230939
Jul. 26, 1989 [JP] Japan .................................. 1-193134

[51] Int. Cl.$^5$ ..................... H01L 23/48; H01L 29/44; H01L 29/52; H01L 29/60
[52] U.S. Cl. ........................................ 357/69; 357/68; 357/23.14; 333/247
[58] Field of Search .................. 357/68, 22, 69, 23.14; 333/247, 246

[56] References Cited

U.S. PATENT DOCUMENTS

| 3,786,375 | 1/1974 | Sato et al. ............................ 333/247 |
| 3,982,271 | 9/1976 | Olivieri et al. ....................... 357/81 |
| 4,097,890 | 6/1978 | Morris et al. ......................... 357/55 |
| 4,733,195 | 3/1988 | Tserng et al. ........................ 330/286 |

FOREIGN PATENT DOCUMENTS

| 2565030 | 11/1985 | France . |
| 54-49066 | 4/1979 | Japan .................................. 357/69 |
| 58-59601 | 4/1983 | Japan .................................. 333/247 |
| 58-115842 | 7/1983 | Japan .................................. 357/69 |
| 60-106202 | 10/1985 | Japan . |
| 61-285811 | 5/1987 | Japan . |

OTHER PUBLICATIONS

Bastida et al., "Airbridge Gate ... Monolithic Circuits", IEEE Transactions on Electron Devices, vol. ED-32, No. 12, Dec. 1985, pp. 2754-2759.
Itoh et al., "Fabrication of ... its Characteristics", IEICE Technical Report, vol. 88, No. 60, ED88-16 (1988), pp. 39-44.
Fink et al., "Electronics Engineers' Handbook", Second Edition, McGraw-Hill Book Company, pp. 7-80.

Primary Examiner—Andrew J. James
Assistant Examiner—D. Monin
Attorney, Agent, or Firm—Leydig, Voit & Mayer

[57] ABSTRACT

A field effect transistor chip for connection to a microstrip transmission line includes a semiconductor substrate, a field effect transistor formed in the substrate, source, gate, and drain electrodes disposed at least partially on the substrate, the gate and source electrodes forming an air bridge, and gate and drain beam leads extending from the substrate for electrical connection to the conductors of a microstrip transmission line. The microstrip transmission line includes dielectric substrates on which substantially uniform width conductors are disposed, the substrates being separated by a gap in which the transistor chip is disposed. The beam leads may be unitary with the electrodes of the chip or with the conductors of the transmission line.

12 Claims, 9 Drawing Sheets

FIELD EFFECT TRANSISTOR FOR MICROSTRIP MOUNTING AND MICROSTRIP-MOUNTED TRANSISTOR ASSEMBLY

FIELD OF THE INVENTION

The present invention relates to a microstrip-mountable field effect transistor (FET) and, more particularly, to an improved electrode structure for microstrip mounting of an FET for use at microwave frequencies, particularly in the millimeter wave band. The present invention further relates to an improvement in an assembly including a microstrip transmission line and a field effect transistor mounted to it.

BACKGROUND OF THE INVENTION

Plan views of the structures of two gallium arsenide (GaAs) FETs which have been widely used are shown in FIGS. 3(a) and 3(b). Each of the FETs shown is formed on a semiconductor substrate 1, usually GaAs. This discrete semiconductor substrate carrying one or more FETs is referred to here as a chip. Each of the chips 100 of FIGS. 3(a) and 3(b) includes one FET. Source electrodes 2, gate electrodes 3, and drain electrodes 4 are disposed on a surface of the GaAs substrate 1. The source and drain electrodes 2 and 4 are electrically connected to the source and drain, respectively, of the FET. The source and drain are formed in the semiconductor substrate 1 in a conducting layer disposed at the surface of the semiconductor substrate 1. The electrically conducting layer may be formed by any conventional process, such as ion implantation, diffusion, or the like. A thin linear gate 3a is located between the source and drain of each transistor and is connected to the gate electrode 3.

In the structure of FIG. 3(a), the length of linear gate 3a lies at a right angle to the flow of the signal which is input to the gate electrode 3 and output from the drain electrode 4. In the structure of FIG. 3(b), four linear gates 3a lie parallel to the signal flow from the gate electrode 3a to the drain electrode 4.

FIG. 4 shows the FET chip 100 of FIG. 3(a) connected in a microstrip transmission line 20. Transmission line 20 includes linear, relatively narrow conductors 7 and 8 disposed on respective dielectric substrates 9 and 10. The source electrode from FET chip 100 is connected to ground by a wire 12. Transmission line 20 may include a ground plane disposed on the opposite side of the dielectric substrates 9 and 10 from conductors 7 and 8 to which wire 12 is connected. The gate electrode 3 and the drain electrode 4 of the chip 100 are connected to microstrip conductors 7 and 8 by wires 13 and 14, respectively. Wires 12, 13, and 14 may be relatively thin gold wires. A direct current (DC) bias voltage is applied to the gate electrode 3 and the drain electrode 4 through the microstrip transmission line conductors 7 and 8. The microwave signal to be amplified is supplied through the microstrip conductor 7 and the wires 13 to the gate electrode 3. The amplified signal is output to microstrip transmission line conductor 8 through the drain electrode 4 in the wires 14.

The characteristics of assemblies of FET chips 100 connected in microstrip transmission line mountings can vary a great deal from assembly to assembly. These performance variations can result from variations in the lengths and positions of the connection wires 12, 13, and 14, since those wires are subject to bending and variations in their relative bonding positions on the respective electrodes when chips are mounted in transmission lines. These variations alter the values of the parasitic reactive circuit elements that are always present in the assembly, particularly the parasitic inductance. The parasitic elements limit the gain, frequency, response, and other performance characteristics of the assembly.

In monolithic FETs, electrodes are directly connected to other circuit elements. An example of a monolithic FET employing an air bridge gate connection is described by Bastida et al in *IEEE Transactions on Electron Devices*, Volume ED-32, December 1985, pages 2754-2759. In FIGS. 1b and 6 of that article, an FET structure is shown including a gold gate connection from the gate to a gate electrode. The gold connection is spaced by an air gap from an underlying source electrode. The source is grounded through a metal via that passes through the semiconductor substrate from the front side source electrode to a rear side source contact. In one embodiment of the structure disclosed, the air bridge connection to the gate includes a plurality of conducting fingers in a comb-like portion of the air bridge structure. While the air bridge electrode arrangement provides improved amplifier frequency response because of a reduction of the effects of the parasitic elements, the structure disclosed is not suitable for mounting in a microstrip transmission line. Instead, the disclosed structure is connected directly to other amplifier elements on the same substrate employing conventional metal integrated circuit interconnections.

Accordingly, it would be desirable to provide an FET structure suitable for connection in a microstrip transmission line that would be free from variations in the values of parasitic elements from transistor assembly to transistor assembly.

SUMMARY OF THE INVENTION

An object of the present invention is the provision of a field effect transistor for connection in a microstrip transmission line and an assembly of a transmission line and a field effect transistor that are free from performance variations from assembly to assembly caused by non-uniform interconnection of the FET and the microstrip.

Still another object of the invention is the provision of a microstrip transmission line that is likewise free from performance variations resulting from non-uniformity in interconnections between the transmission line and FETs.

A field effect transistor chip for connection to a microstrip transmission line according to the invention includes a semiconductor substrate, a field effect transistor including a gate, a source, and a drain formed in and accessible from a surface of the substrate, a source electrode disposed on the surface of the substrate and in electrical contract with the source, gate and drain electrodes disposed at least partially on the surface of the substrate, the gate and source electrodes forming an air bridge so that they cross over and are electrically insulated from each other, and a gate beam lead and a drain beam lead extending from the gate and drain electrodes, respectively, beyond the substrate for connection to microstrip transmission line conductors. Preferably the gate and drain electrodes and gate and drain beam leads all have the same width, a width substantially equal to that of the conductors of the microstrip transmission line to which they are to be connected.

The air bridge may be formed by a portion of the gate electrode spaced from the substrate and crossing above the source electrode. Alternatively, the air bridge may include a portion of the source electrode spaced from and passing above the gate electrode.

An assembly of an FET chip and a microstrip transmission line according to the invention includes a microstrip transmission line having dielectric substrates on which are disposed electrical conductors having a substantially uniform width, the substrates being spaced apart by an intervening gap in which an FET chip is disposed. The FET chip includes a semiconductor substrate, a field effect transistor including a gate, a source, and a drain formed in and accessible from a surface of the substrate, a source electrode disposed on the surface of the substrate and in electrical contract with the source, gate and drain electrodes disposed at least partially on the surface of the substrate, the gate and source electrodes forming an air bridge so that they cross over and are electrically insulated from each other, and a gate beam lead and a drain beam lead extending beyond the substrate between and electrically connecting the gate and drain electrodes to the respective conductors of the microstrip transmission line.

Preferably the gate and drain electrodes and gate and drain beam leads all have the same width, a width substantially equal to that of the conductors of the microstrip transmission line to which they are connected. The beam leads may be unitary with the gate and drain electrodes of the FET chip or may be unitary with the conductors of the microstrip transmission line.

Other objects and advantages of the present invention will become apparent from the detailed description given hereinafter. It should be understood, however, that the detailed description and specific embodiments are given by way of illustration only, since various changes and modifications within the spirit and scope of the invention will become apparent from the detailed description.

DETAILED DESCRIPTION OF PREFERRED EMBODIMENTS

Figure 1:
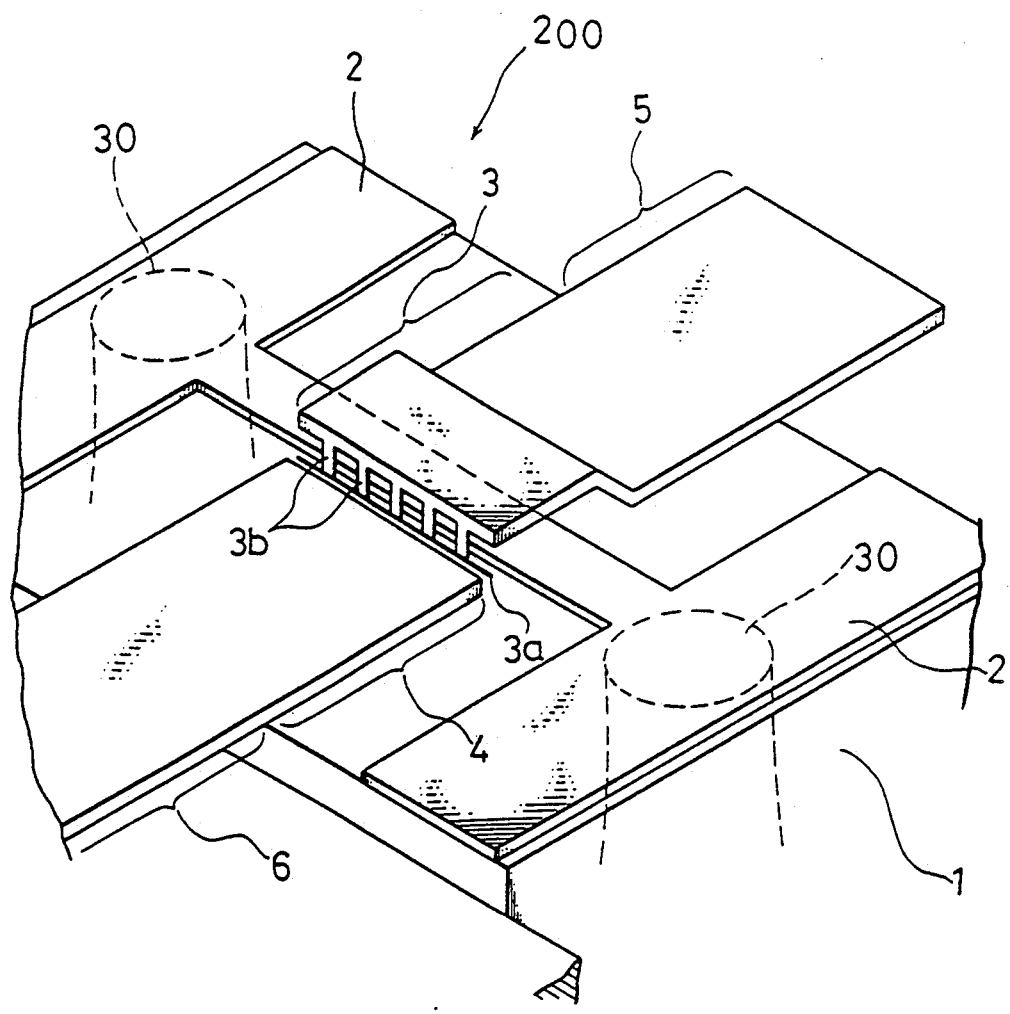
FIG. 1 is a perspective view of an FET according to an embodiment of the present invention.
Figure 2:
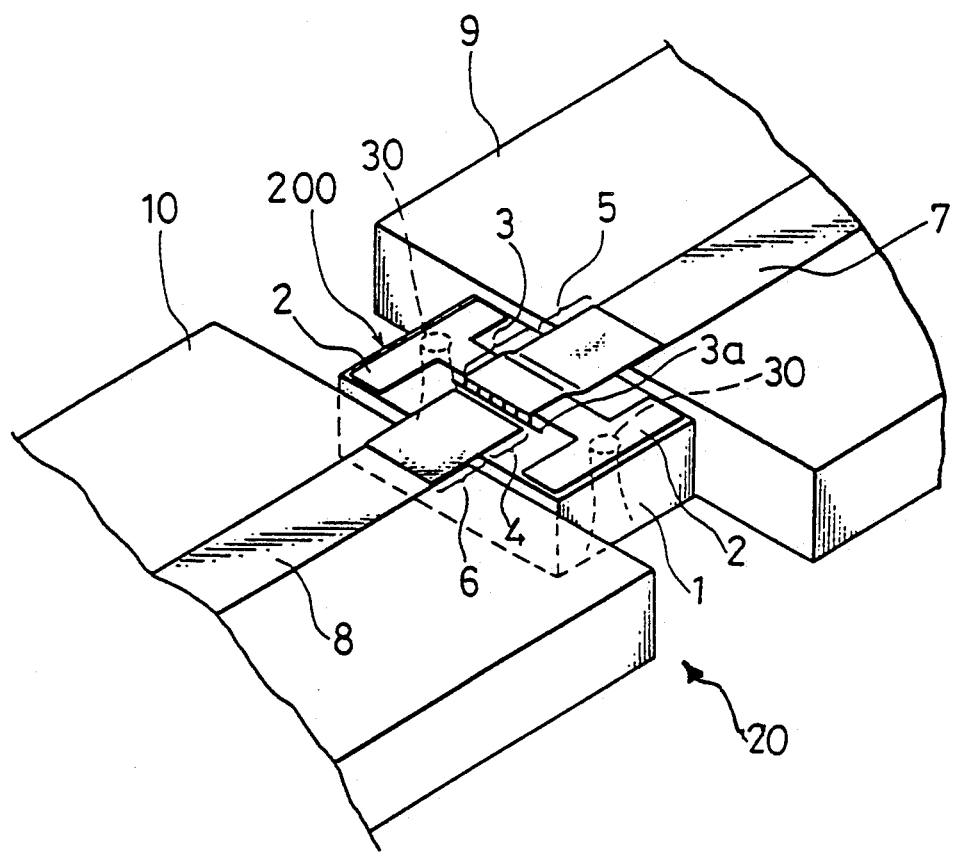
FIG. 2 is a perspective view of an assembly including the FET chip of FIG. 1 connected to a microstrip transmission line according to the invention.
Figure 3A:
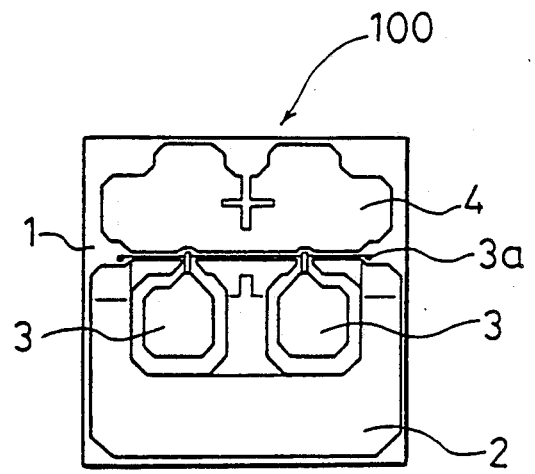
FIGS. 3(a) and 3(b) are plan views of the structures of two prior art FETs.
Figure 3B:
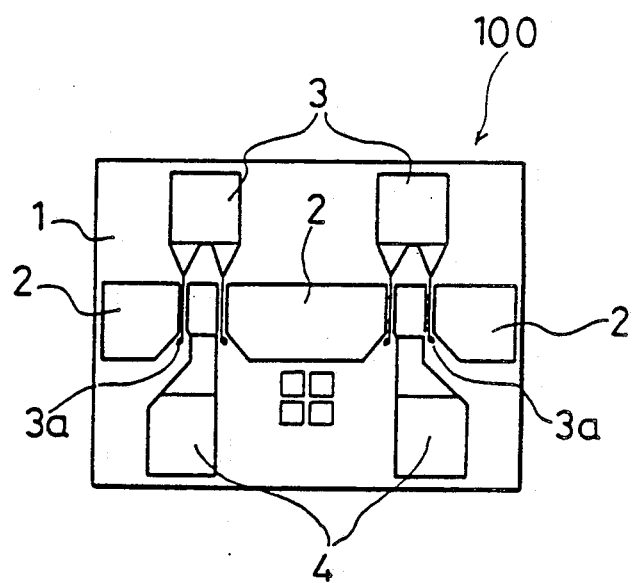
Figure 4:
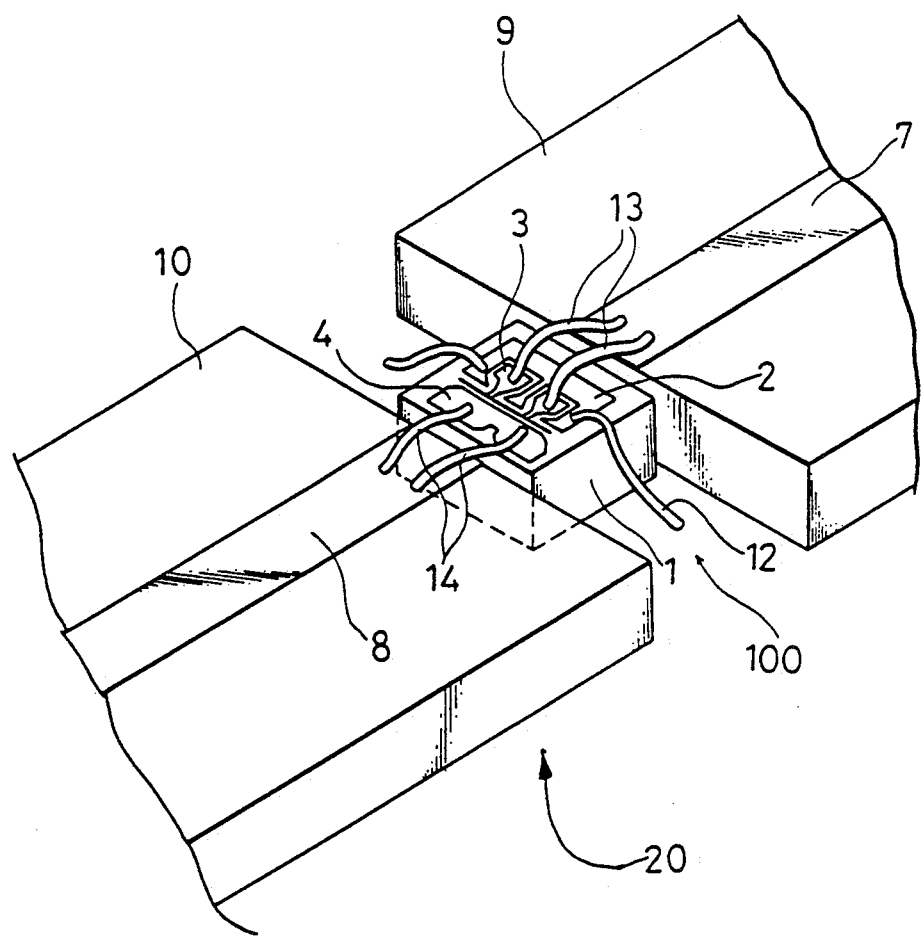
FIG. 4 is a perspective view of an assembly including the prior art FET chip of FIG. 3(a) and a microstrip transmission line.

FIGS. 1 and 2 are perspective views of a microstrip-mountable field effect transistor chip 200 and an assembly of the chip 200 and a microstrip transmission line 20, respectively, all according to embodiments of the present invention. In all figures, the same reference numerals designate the same or corresponding elements. In the invention, interconnecting wires 12, 13, and 14 of FIG. 4 are eliminated. Wires 13 and 14 are replaced by beam leads 5 and 6, respectively, and wire 12 is replaced by an electrode structure including vias extending through the semiconductor substrate 1. As shown in FIGS. 1 and 2, gate electrode 3 includes a beam lead 5 and the drain electrode 4 includes a beam lead 6. Beam leads 5 and 6 are directly connected to the substantially uniform width microstrip conductors 7 and 8, respectively. In the invention, the gate and the drain electrodes of the FET of FIG. 4 are replaced by an air bridge structure.

The term beam leads as used here refers to electrically conductive ribbons, usually rectangular in cross-section, that extend to the edge of and beyond a substrate, much like cantilevered beams. Beam lead technology has been employed in semiconductor device packaging for some years and the term beam lead is well understood in the art to refer to an electrode projecting generally parallel and beyond the limit of a surface for making an electrical connection to an electrical element lying on the other side of the surface.

In FIGS. 1 and 2, the gate beam lead 5 and the drain beam lead 6 are unitary with and are extensions of the gate electrode 3 and drain electrode 4, respectively. Preferably, the widths of the beam leads are substantially equal to the widths of the respective electrodes and the microstrip conductors 7 and 8. As shown in FIGS. 1 and 2, the beam leads are aligned with the respective microstrip conductors and joined to them effectively as a continuation of those conductors.

The source electrode 2 of the FET chip 100 of FIGS. 1 and 2 has an H shape on the surface of the substrate 1. The central portion of the H connecting the two legs passes beneath an air bridge portion of the gate electrode 3 that is connected to the gate 3a. Two via holes 30 extend through the semiconductor substrate 1 beneath the legs of the H-shaped source electrode 2. Those via holes are filled or plated with a metal and form electrical connections from the source electrode 2 on the front surface of the semiconductor chip 1 to a grounded electrode 26 disposed on the rear surface of the substrate 1. In an FET chip employing a square substrate about 500 microns on a side, via holes 30 are typically about 100 microns in diameter.

The air bridge structure of the gate electrode 3 crosses the source electrode 2 and is separated and electrically insulated from it by an air gap. Part of the gate electrode 3 is disposed directly on the surface of the semiconductor substrate 1. Just opposite the linear gate 3a, a portion of gate electrode 3 is spaced from the substrate and crosses over the source electrode 2, The air bridge includes an essentially right angle bend and a portion of the gate electrode 3 that is nearly perpendicular to the surface of the semiconductor substrate 1. That perpendicular portion completes the connection to the linear gate 3a. Preferably, to improve the high frequency performance of the FET and to reduce the effects of the parasitic circuit elements, the connections perpendicular to the substrate from the spaced portion of the gate electrode 3 to the linear gate 3a consist of spaced-apart electrically conductive fingers 3b. These fingers 3b reinforce the three-dimensional structure in addition to reducing the parasitic elements of the circuitry.

Steps in the production of the FET chip 200 of FIG. 1 are illustrated in FIGS. 5(a) to 5(l). Initially, an electrically conductive layer is formed in an insulating or semi-insulating substrate 1. This active layer is the channel between the source and drain of the FET being constructed. Using conventional photoresist and photolithography techniques, a region of the substrate near the surface is selectively removed by etching to produce the mesa shown in FIG. 5(a). The active layer is confined to the mesa and, thereby, is electrically isolated from the remainder of substrate 1.

Figure 5A:
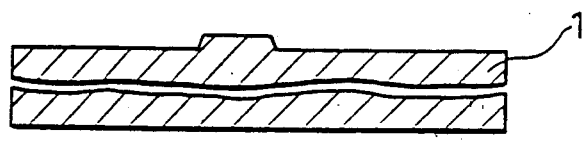
FIGS. 5(a) to 5(l) are cross-sectional views illustrating the steps in a process for producing an FET chip embodiment according to the invention.
Figure 5B:
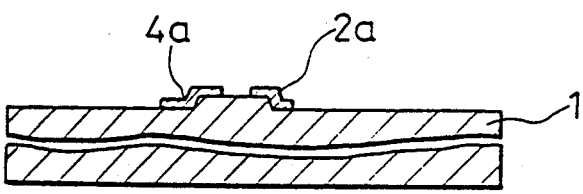
Figure 5C:
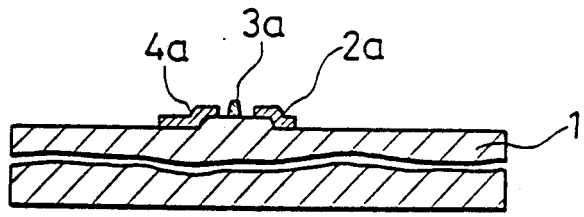

Next, as shown in FIG. 5(b), source and drain electrodes 2a and 4a are deposited on the surface of the substrate 1 on opposite edges of and overlapping the mesa. The electrodes and the substrate 1 are alloyed in a heat-treating step. Metal for linear gate 3a is deposited between the source and drain electrodes 2a and 4a as shown in FIG. 5(c). Linear gate 3a is defined and properly located by employing conventional photolithography techniques. Typically, linear gate 3a forms a Schottky barrier FET.

Figure 5D:
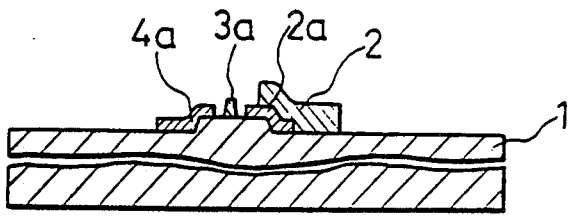
Figure 5E:
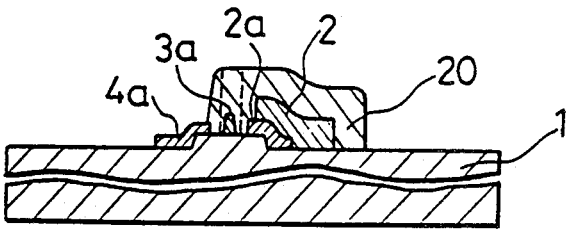
Figure 5F:
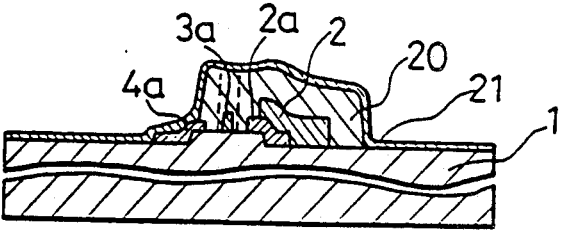

The H-shaped source electrode 2 is deposited and formed into the desired pattern using conventional metal deposition and photolithography techniques, such as the lift-off process. The deposited source electrode is illustrated in FIG. 5(d). Subsequently, the air bridge electrode structure is formed. First, a base photoresist layer 20 is deposited and patterned for temporarily supporting the spaced portion of the air bridge as illustrated in FIG. 5(e). A temporary plating electrode 21 for conducting electricity to plate the air bridge and drain electrodes is deposited on the front surface of substrate 1, the surface containing the other features already described (see FIG. 5(f)).

Figure 5G:
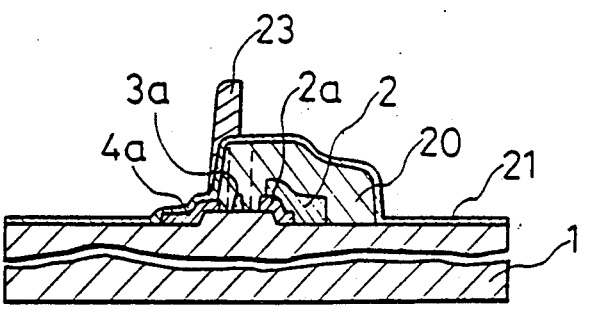
Figure 5H:
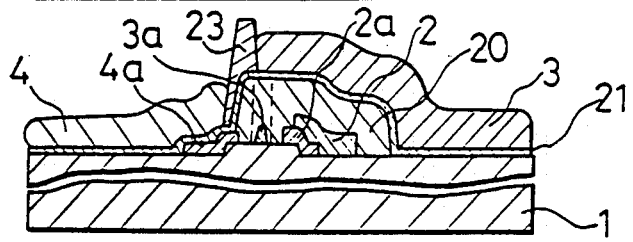
Figure 5I:
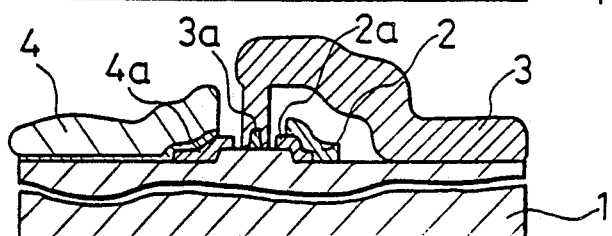
Figure 5J:
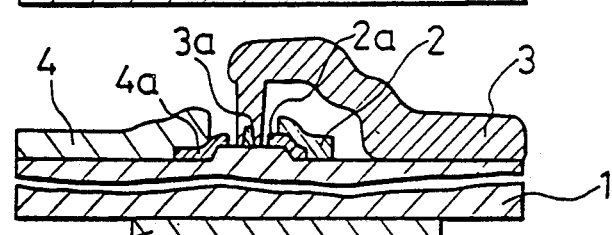

Before depositing the gold air bridge electrode, a second photoresist region 23 is deposited as a plating mask on the plating electrode 21 opposite an area between the linear gate 3a and the drain electrode 4a. Photoresist region 23 is formed in the desired shape at the desired location using the usual photolithography techniques. FIG. 5(g) shows the placement and shape of second photoresist region 23. Next, a metal, preferably gold, is plated on the entire top surface of the mask substrate in an electrolytic process. Plating electrode 21 is employed as one of the electrodes for the plating process. No plating takes place on region 23 since it is electrically isolated from the plating electrode 21. The plating produces the gold films that will become the air bridge electrode as well as the beam leads. The thus-plated structure is shown in FIG. 5(h). After the metal plating, the supporting and protecting photoresist regions 20 and 23 and the temporary electrode 21, where exposed, are removed with appropriate solvents to produce the structure of FIG. 5(i).

After the foregoing steps are completed, the substrate is temporarily attached at its front surface, i.e., the surface containing the active layer, to a polishing holder. The substrate is then polished at the rear surface to reduce its thickness. A photoresist pattern 25 is deposited on the rear surface of the substrate 1, leaving exposed portions that are opposite the extremities of the gold plating of the drain and source leads. Also left exposed are portions of the substrate 1 where via holes 30 are to be produced within the substrate 1. The partially completed FET chip is shown in this state in FIG. 5(j).

Figure 5K:
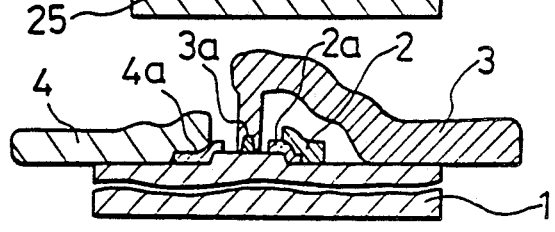
Figure 5L:
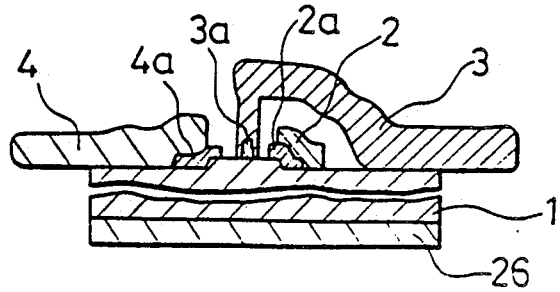

The substrate 1 is etched from the rear surface with the photoresist 25 as a mask. The etching is continued until the total thickness of the unmasked portion of the substrate is removed. If several of the described FET chips are being made on the same wafer, this etching step separates the chips from each other. In addition, the etching step forms the via holes and leaves the metal plating extending over the edges of the substrate 1 as the beam leads 5 and 6 as shown in FIG. 5(k). Finally, metal is plated on the rear surface of semiconductor substrate 1 as an electrode 26 and in the via holes 30 to connect the source electrode 2 on the front side of the substrate to the electrode 26. That interconnection permits the source electrode 2 to be grounded easily, particularly to a ground plane of a microstrip transmission line. The final plating step completes the FET chip 200 as shown in FIGS. 1, 2, and 5(l).

The connection of the FET chip 200 to the conductors 7 and 8 of the microstrip transmission line 20 is easily carried out with uniform results from chip to chip. The chip 200 is placed in the gap between the microstrip dielectric substrates 9 and 10 with the gate and drain beam leads 5 and 6 aligned with the microstrip conductors 7 and 8, respectively. The beam leads are pressure-welded to the microstrip conductors to form the assembly shown in FIG. 2. The interconnection is completed by grounding source electrode 2, e.g., by connecting the rear surface electrode 26 to the ground plane of the microstrip transmission line.

With beam leads 5 and 6 uniform in size and orientation, the FET chip 200 and the microstrip conductors can be easily and uniformly connected with each other. Unlike the wire connections of the prior art device shown in FIG. 4, there are no variations in lead location or size that may produce variations in FET characteristics. Frequency-sensitive transmission losses that occur when small wires are attached to the much wider microstrip conductors are reduced because the widths of the beam leads are made substantially equal to the widths of the microstrip conductors. Preferably, as shown in FIGS. 1 and 2, the width of the gate electrode 3 is uniform from the air bridge to the gate beam lead 5. Likewise, it is preferred that drain electrode 4 have substantially the same width as the drain beam lead 6 and as the microstrip conductor 8 to which it is attached to reduce high frequency transmission losses.

Figure 6A:
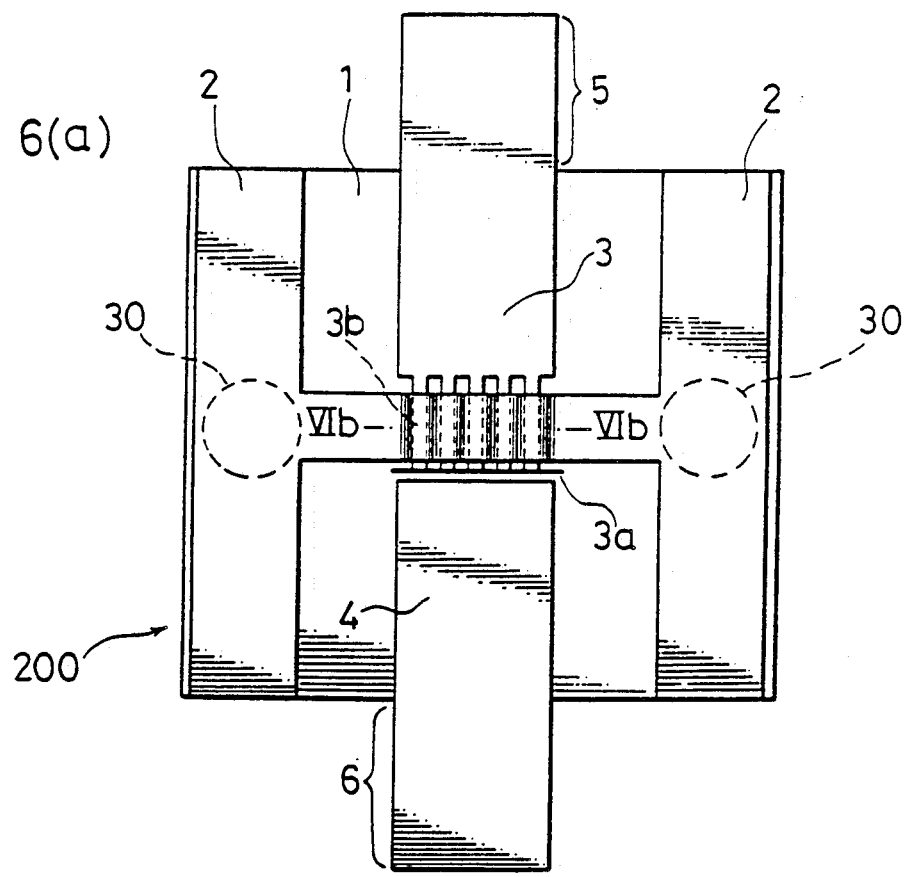
FIGS. 6(a) and 6(b) are plan and sectional side views, respectively, of an FET chip according to an embodiment of the invention.
Figure 6B:
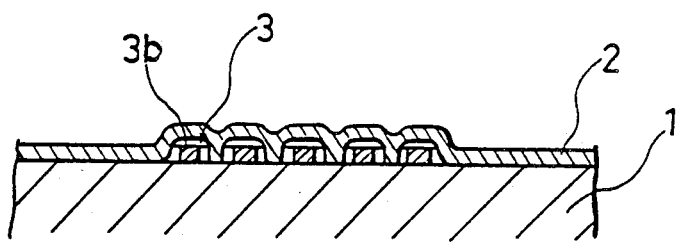

In the embodiment of the invention described with respect to FIGS. 1 and 2, an air bridge structure is employed so that a portion of the gate electrode 3 is spaced from the front surface of the semiconductor substrate 1 by an air gap and passes over the source electrode 2. However, the air bridge may be formed by spacing part of the source electrode from the front surface of the semiconductor substrate 1 and passing the source electrode over the gate electrode 3. FIG. 6(a) is a plan view of an embodiment of the invention employing an air bridge structure for the source electrode. The embodiment of FIG. 6(a) is shown in an enlarged cross-sectional view in FIG. 6(b) taken along VIb—VIb of FIG. 6(a). In this embodiment, the gate electrode 3 employs a plurality of gate connection fingers 3b that are disposed directly on the front surface of the semiconductor substrate 1. In the earlier-described embodiment, those gate fingers were disposed perpendicular to that surface. The fingers 3b connect the relatively wide gate electrode 3 to the linear gate 3a at a plurality of locations to reduce the effects of parasitic circuit elements. The source electrode 2 passes over the gate connection fingers 3b and is, in part, spaced from the surface of the semiconductor substrate 1. In the embodiment of FIGS. 6(a) and 6(b), the source electrode is spaced from each of the gate connection fingers 3b by an air gap but contacts the front surface of the semiconductor substrate 1 between each of the gate connection fingers 3b.

The embodiments of the invention described refer generally to a high frequency GaAs FET chip. The invention can also be applied to various specific types of FETs, for example, a high electron mobility transistor (HEMT), i.e., an FET employing a semi-insulating substrate, an undoped GaAs layer on the substrate, and a thin n-type AlGaAs active layer on which the FET electrodes are disposed. FETs employing indium phosphide (InP) or indium gallium arsenide (InGaAs) or an HEMT using InGaAs in the active layer may incorporate the invention.

In the described embodiments, the widths of the gate and drain electrodes and their respective beam leads are uniform and substantially equal to the uniform widths of the microstrip conductors. However, when the length of the linear gate 3a is significantly different from the width of the microstrip line, only the beam leads have widths equal to those of the microstrip conductors. In that arrangement, the widths of the gate and drain electrodes are preferably smoothly varied, rather than abruptly changed, between the gate length and the microstrip conductor width in order not to reduce the high frequency performance of the chip. In still other embodiments, the beam lead widths may be wider or narrower than the widths of the microstrip conductors.

Figure 7:
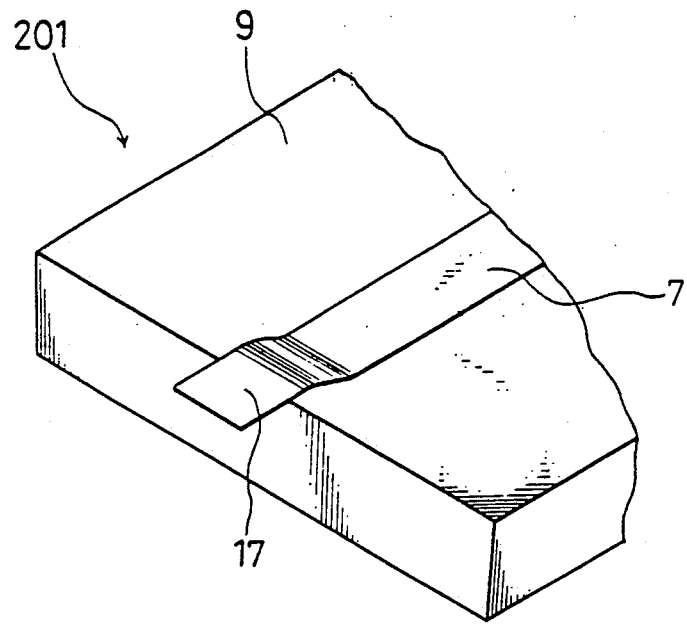
FIG. 7 is a perspective view of a portion of a microstrip transmission line including a beam lead according to the invention.
Figure 8:
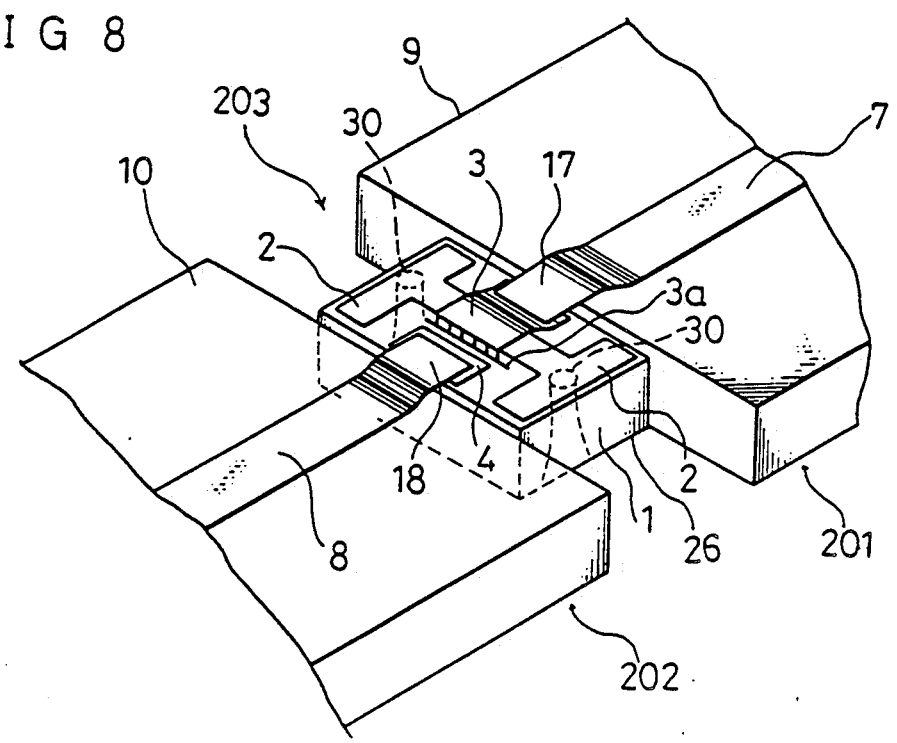
FIG. 8 is a perspective view of an assembly including an FET chip connected to the microstrip transmission line of FIG. 7 according to the invention.

In the embodiments described, the beam leads 5 and 6 are manufactured as a unitary part of the electrodes of the FET chip 200. However, the beam leads may be part of and unitary with the microstrip transmission line conductors. FIGS. 7 and 8 are perspective views of a microstrip transmission line and assembly including an FET chip according to another embodiment of the invention. In this embodiment, beam leads 17 and 18 are a unitary part of the microstrip conductors 7 and 8, respectively. The beam leads 17 and 18 extend outwardly from and beyond the ends of the dielectric substrates 9 and 10.

In FIG. 8, an FET chip 203 is similar to the chip 200 of FIG. 1 except that neither the gate electrode 3 nor the drain electrode 4 includes beam leads. In this embodiment, the beam leads 17 and 18 are attached to the electrodes directly on the semiconductor substrate 1 rather than having the attachment take place on the conductors 7 and 8 of the microstrip transmission line.

Figure 9A:
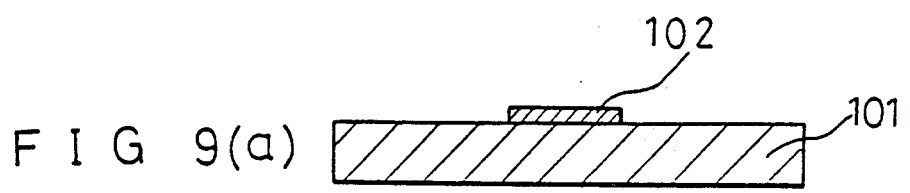
FIGS. 9(a) to 9(e) are cross-sectional views illustrating the steps in a process for producing the microstrip transmission line of FIG. 7.
Figure 9B:
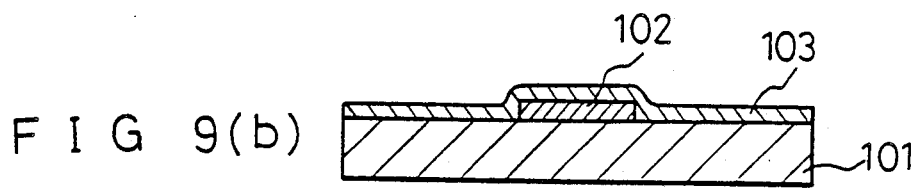

A method of producing the beam leads of FIGS. 7 and 8 is illustrated in FIGS. 9(a) to 9(e). The process begins with a dielectric body 101, which may be alumina, on the front surface of which a first photoresist film 102 is deposited at a selected region as shown in FIG. 9(a). A metallization 103, such as a nickel/gold alloy, is deposited on the entire front surface of the dielectric body as illustrated in FIG. 9(b).

Figure 9C:
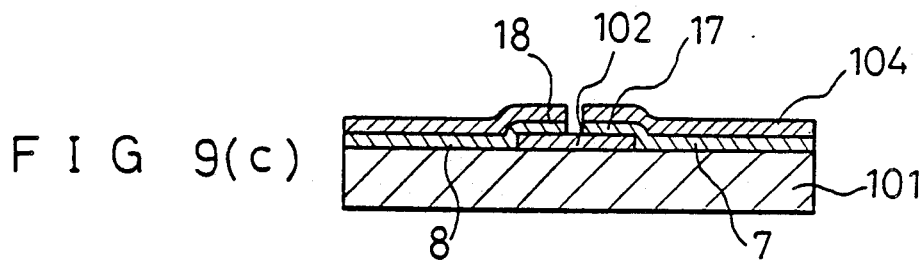

A second photoresist film 104 is deposited over metallization 103 and a pattern corresponding to the microstrip conductors is formed. In addition, the photoresist is removed from a portion of the metallization 103 opposite film 102 in a pattern transverse to that of the microstrip conductors. Using the photoresist film 104 as a mask, the exposed metal is removed by etching, leaving microstrip conductors 7 and 8 disposed directly on body 101 with end portions spaced from body 101 and overlying photoresist film 102. This structure is illustrated in FIG. 9(c).

Figure 9D:
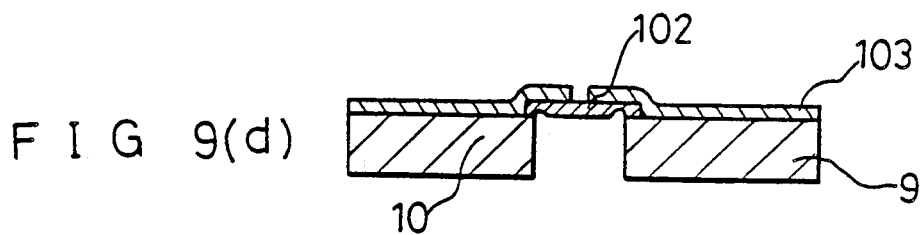
Figure 9E:
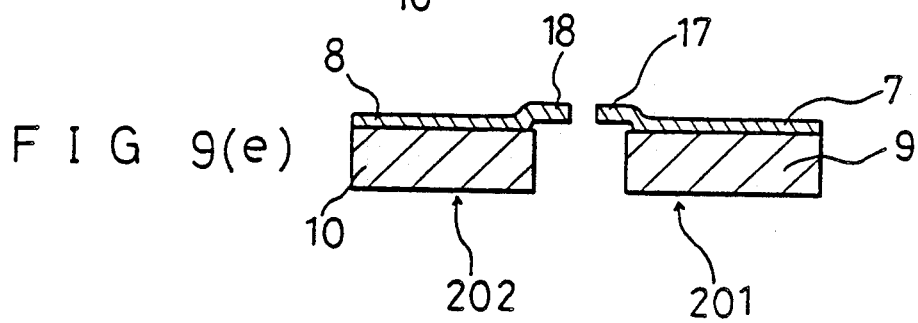

The photoresist film 104 is removed and a portion of the body 101 opposite the photoresist film 102 is removed by sawing or dicing from the rear surface of the substrate. The sawing operation separates the unitary body 101 into parts 201 and 202, i.e., substrates 9 and 10, as shown in FIG. 9(d). Finally, the first photoresist film 102 is removed, completing the microstrip transmission line including substrates 9 and 10 on which are disposed conductors 7 and 8, respectively, with beam leads 17 and 18 respectively projecting from and extending over the edges of substrates 9 and 10. This completed structure is shown in FIG. 9(e).

The microstrip transmission line including the beam leads 17 and 18 and the FET chip 203 are assembled as shown in FIG. 8. The FET chip 203 is disposed in the gap between the substrates 9 and 10, i.e., portions 201 and 202, with the gate electrode 3 and the drain electrode 4 aligned with the beam leads 17 and 18, respectively. Thereafter, the beam leads 17 and 18 are pressure-welded to the gate and drain electrodes 3 and 4, respectively. The source electrode 2 is grounded through the via holes 30 and the rear electrode 26 of the semiconductor substrate 1.

The embodiment of the invention shown in FIGS. 7 and 8 does not require that beam leads be produced on the FET chip 203. Therefore, in this embodiment, the process for producing the chip 203 is simplified, improving its yield. Although the embodiment of the invention shown in FIGS. 7, 8 and 9(e) is described as employing alumina for the dielectric substrate of the microstrip transmission line, other dielectric materials, such as sapphire, may also be used. However, since sapphire is a very hard material, special sawing or dicing techniques are required to carry out the step illustrated in FIG. 9(d) when a sapphire substrate is employed.

I claim:

1. A field effect transistor chip for connection to a microstrip transmission line comprising:

a semiconductor substrate having first and second generally opposed surfaces;

a field effect transistor formed in said semiconductor substrate including a gate, a source, and a drain, all accessible from said first surface;

opposed drain and gate electrodes of substantially the same width respectively electrically connected to said drain and gate and disposed on said first surface;

a source electrode electrically connected to said source disposed partially on said first surface and forming an air bridge so that said source electrode crosses over and is electrically insulated from said gate electrode; and a gate beam lead and a drain beam lead respectively electrically connected to said gate and drain electrodes, each beam lead including an extension extending beyond said semiconductor substrate for connection to microstrip transmission line conductors wherein said gate and drain beam leads each have widths transverse to the extension of said gate and drain beams leads beyond said substrate and the widths of said gate electrode and said gate beam electrode, and of said drain electrode and said drain beam electrode, are substantially equal, respectively.

2. The field effect transistor chip of claim 1 wherein said gate electrode includes a plurality of electrically conducting fingers electrically connected to said gate on said first surface.

3. The field effect transistor chip of claim 2 wherein said air bridge includes portions of said source electrode spaced from each of said electrically conductive fingers and contacting said first surface between said fingers.

4. The field effect transistor chip of claim 1 wherein said source electrode is in electrical contact with said second surface through a metallized via extending through said substrate from said first surface to said second surface.

5. A microstrip transmission line and field effect transistor chip assembly comprising:
   a microstrip transmission line including first and second dielectric substrates on which are disposed first and second electrical conductors, respectively, each having a substantially uniform width, said first and second substrates being spaced apart by an intervening gap;
   a semiconductor substrate having first and second generally opposed surfaces, said semiconductor substrate being disposed in the gap between said first and second dielectric substrates;
   a field effect transistor formed in said semiconductor substrate including a gate, a source, and a drain, all accessible from said first surface;
   opposed drain and gate electrodes of substantially the same width respectively electrically connected to said drain and gate and disposed at least partially on said first surface;
   a source electrode electrically connected to said source disposed at least partially on said first surface and forming an air bridge so that said source electrode crosses and is electrically insulated from said gate electrode; and
   a gate beam lead and a drain beam lead respectively electrically connected to said gate and drain electrodes, each beam lead including an extension extending beyond said semiconductor substrate between and electrically connecting said gate and drain electrodes to said first and second conductors, respectively wherein said gate and drain beam leads each have widths transverse to the extension of said gate and drain beam leads beyond said substrate and the widths of said gate electrode, said gate beam electrode, said drain electrode, said drain beam electrode, and said first and second electrical conductors are substantially equal.

6. The assembly of claim 5 wherein said air bridges includes a portion of said gate electrode spaced from said first surface and said source electrode by an air gap, said source electrode being disposed on said first surface.

7. The assembly of claim 6 wherein said gate electrode includes a plurality of electrically conducting fingers extending from the portion of said gate electrode spaced from said first surface to and electrically connected to said gate at said first surface.

8. The assembly of claim 5 wherein said air bridge includes a portion of said source electrode spaced from said first surface and said gate electrode by an air gap, said gate electrode being disposed on said first surface.

9. The assembly of claim 8 wherein said gate electrode includes a plurality of electrically conducting fingers electrically connected to said gate on said first surface.

10. The assembly of claim 9 wherein said air bridge includes portions of said source electrode spaced from each of said electrically conductive fingers and contacting said first surface between said fingers.

11. The assembly of claim 5 wherein said source electrode is in electrical contact with said second surface through a metallized via extending through said substrate from said first surface to said second surface.

12. The assembly of claim 5 wherein said gate and drain beam leads are unitary portions of said gate and drain electrodes extending to said first and second conductors.

* * * * *